United States Patent
Kumar et al.

(10) Patent No.: US 10,658,357 B2
(45) Date of Patent: May 19, 2020

(54) DRIVER FOR DRIVING A CAPACITIVE LOAD

(71) Applicant: TEXAS INSTRUMENTS INCORPORATED, Dallas, TX (US)

(72) Inventors: Pranav Kumar, Hatia (IN); Yogesh Darwhekar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/990,880

(22) Filed: May 29, 2018

(65) Prior Publication Data

US 2019/0252373 A1 Aug. 15, 2019

(30) Foreign Application Priority Data

Feb. 13, 2018 (IN) .............................. 201841005368

(51) Int. Cl.
*H01L 27/06* (2006.01)
*H03K 19/018* (2006.01)
*H01L 29/73* (2006.01)

(52) U.S. Cl.
CPC ...... *H01L 27/0647* (2013.01); *H01L 29/7302* (2013.01); *H03K 19/01825* (2013.01); *H03K 19/01837* (2013.01)

(58) Field of Classification Search
CPC ........ H03K 19/01825; H03K 19/01837; H01L 29/7302; H01L 27/0647
USPC ........ 327/108–112, 427, 432, 434, 437, 170, 327/172–176, 373–377; 326/82, 83, 326/87–92
See application file for complete search history.

(56) References Cited

U.S. PATENT DOCUMENTS

| | | | |
|---|---|---|---|
| 4,590,613 A | 5/1986 | Tannery, IV | |
| 5,949,264 A | 9/1999 | Lo | |
| 6,058,294 A * | 5/2000 | Bruwer | H03B 5/20 307/109 |
| 6,426,677 B1 | 7/2002 | Prentice | |
| 7,145,266 B2 | 5/2006 | Lynch et al. | |
| 2003/0075748 A1* | 4/2003 | Furuie | H03K 17/0406 257/296 |
| 2005/0122141 A1* | 6/2005 | Balhiser | H03K 19/01707 327/112 |
| 2007/0096823 A1 | 5/2007 | Wang et al. | |

OTHER PUBLICATIONS

International Search Report in corresponding PCT Patent Application No. PCT/2019-017755, dated Apr. 25, 2019 (2 pages).

* cited by examiner

*Primary Examiner* — Tomi Skibinski
(74) *Attorney, Agent, or Firm* — Ray A. King; Charles A. Brill; Frank D. Cimino

(57) ABSTRACT

A circuit includes a first bipolar junction transistor (BJT) including a first base, a first collector, and a first emitter, the first collector connected to a first supply voltage node and a second BJT including a second base, a second collector, and a second emitter, the second collector connected to the first emitter at an output node. The circuit also includes a capacitor including a first capacitor terminal and a second capacitor terminal, the first capacitor terminal connected to the second emitter of the second BJT and the second capacitor terminal connected to a second supply voltage node. A current source device is also included that is connected in parallel with the capacitor.

16 Claims, 4 Drawing Sheets

DRIVER FOR DRIVING A CAPACITIVE LOAD

CROSS-REFERENCE TO RELATED APPLICATIONS

This application claims priority to India Provisional Application No. 201841005368, filed Feb. 13, 2018, titled "Low Power, High Slew Rate BJT Based Push Pull Driver With Capacitive Boost For Driving Capacitive Loads," which is incorporated herein by reference.

BACKGROUND

Some types of loads that have a capacitive input impedance (e.g., passive mixers) and that require a relatively high slew rate drive for certain performance requirements are driven with a driver circuit that produces relatively large impulse currents to the load. Such driver circuits should be designed for high voltage swing and high slew rates to achieve sufficient linearity and noise performance. Complementary metal oxide semiconductor field effect transistor (CMOS) drivers are generally fairly power efficient but lack sufficient speed performance. Bipolar junction transistor (BJT) drivers are generally faster than CMOS drivers, but require high current levels and thus dissipate much more power than CMOS drivers.

SUMMARY

In one example, a circuit includes a first bipolar junction transistor (BJT) including a first base, a first collector, and a first emitter, the first collector connected to a first supply voltage node and a second BJT including a second base, a second collector, and a second emitter, the second collector connected to the first emitter at an output node. The circuit also includes a capacitor including a first capacitor terminal and a second capacitor terminal, the first capacitor terminal connected to the second emitter of the second BJT and the second capacitor terminal connected to a second supply voltage node. A current source device is also included that is connected in parallel with the capacitor.

In another example, a circuit includes a first BJT, a second BJT, a capacitor connected to the emitter of the second BJT and to a second supply voltage node. The circuit also includes a current source device connected in parallel with the capacitor. A control circuit is coupled to receive the first control signal for the first base and, reciprocal to a logic state of the first control signal, to generate a second control signal for the second base.

In yet another example, a circuit includes a first BJT, a second BJT, and a current source device connected to the emitter of the second BJT at a second node and configured to be coupled to a capacitor at the second node in parallel with the current source device. A control circuit is coupled to receive a first control signal for the first base and, reciprocal to a logic state of the first control signal, to generate a second control signal for the second base.

BRIEF DESCRIPTION OF THE DRAWINGS

For a detailed description of various examples, reference will now be made to the accompanying drawings in which.

DETAILED DESCRIPTION

The disclosed examples are directed to a push-pull BJT driver with capacitive boost to support capacitive load current with lower overall power consumption than in at least some other drivers. The disclosed driver may drive a load such as a capacitive load. In one application, the load is a passive mixer that is driven with a high slew rate square wave control signal and thus the driver delivers a current impulse to the capacitive load during a rise transition of the control signal (charge phase) of a first operational state of the driver. During a subsequent fall transition of the control signal (discharge phase), the driver receives a similarly sized current impulse from the load. More specifically, in one implementation, the driver charges the capacitive load very quickly through a first transistor (e.g., a BJT) in one state of operation of the driver. In a subsequent operational state, the first transistor is turned off and a second transistor is turned on to cause charge from the capacitive load to quickly discharge through a parallel combination of a current source device and a capacitor. Part of the current from the capacitive load charges the capacitor while current through the current source device comprises the remaining portion of the current from the capacitive load. Then, reverting back to the driver's first operational state when the second transistor is turned off and the first transistor is turned on, the charge on the capacitor (previously received from the capacitive load) discharges through the current source device, while the capacitive load is again charged through the first transistor as noted above. The illustrated driver is capable of high speed operation with high slew rate at power consumption levels that are lower than at least some other drivers.

Figure 1:
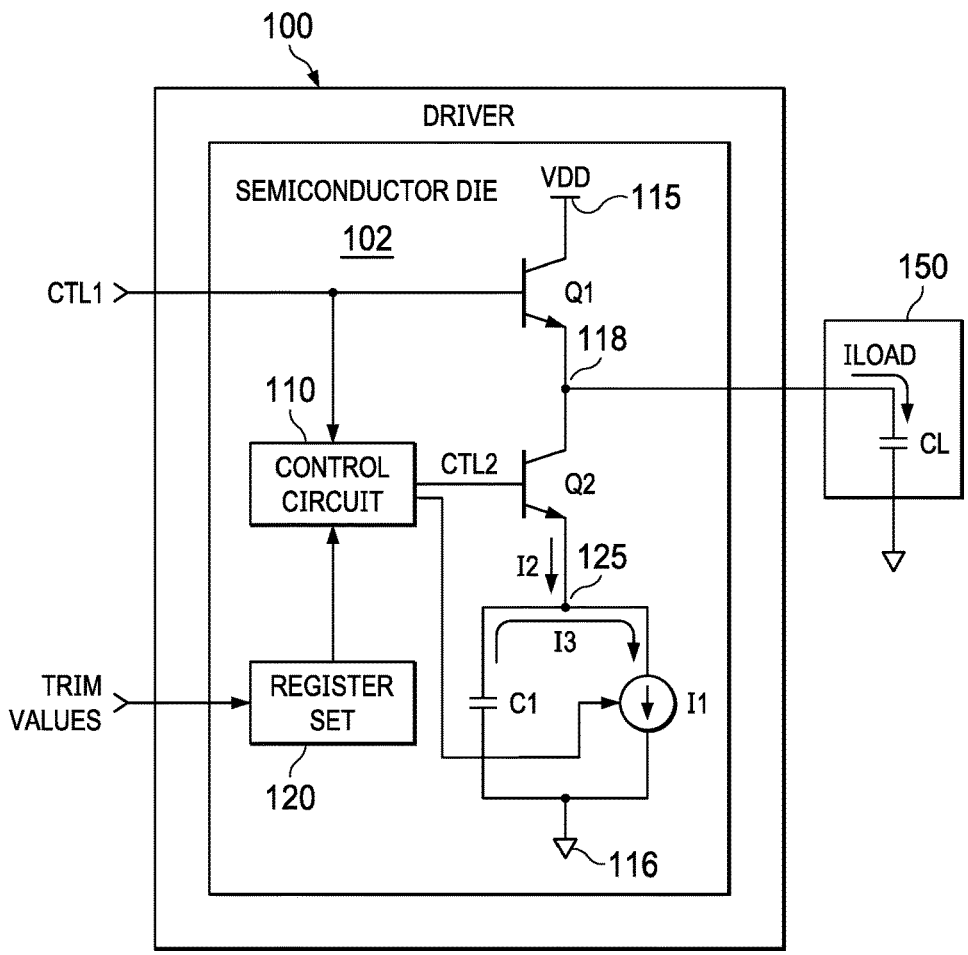
FIG. 1 illustrates a driver for driving a capacitive load in accordance with one example.

FIG. 1 shows an example of a driver 100 for driving a capacitive load 150. The capacitive load 150 is represented by a capacitor CL, and the capacitive load is also referred to herein as capacitive load CL. The capacitive load CL comprises, for example, a passive mixer or other type of load whose input impedance is capacitive. The driver 100 includes transistors Q1 and Q2, a capacitor C1, a current source device I1, a control circuit 110, and a register set 120. Q1 in this example is a bipolar junction transistor (BJT) and specifically an NPN BJT. In other examples, Q1 and Q2 can be implemented using metal oxide semiconductor field effect transistors (MOS). The collector of Q1 is connected to a fixed supply voltage (VDD) node 115. The base of Q1 is coupled to receive an input control signal CTL1. CTL1 is also provided to the control circuit 110. The emitter of Q1 connects to the collector of Q2 at an output node 118. Q1 is configured as voltage follower and thus the voltage on the emitter of Q1 is generated based on CTL1 and provided to the capacitive load CL, which is coupled to the driver 100 at output node 118. Q2 is also configured as a voltage follower that follows the voltage of CTL2 during the rise transition and the high state of CTL2.

In one example, the register set 120 comprises a single externally accessible register. In other examples, the register set 120 comprises two or more externally accessible registers. The register set 120 is programmable and thus can be loaded with one or more trim values by an external device. The trim values are used to trim one or more electrical characteristics of the disclosed circuits as described herein. The register set 120 is accessible to be read by the control circuit 110 for reading. The control circuit 110 also can write the register set in some examples.

The components of the driver 100 including Q1, Q2, C1, I1, the control circuit 110 and the register set 120 are formed on a common semiconductor die 102, that is, Q1, Q2, C1, I1, the control circuit 110 and the register set 120 are on the same chip. The capacitive load CL is not on the same semiconductor die 102 in this example, but in other examples, the capacitive load CL is on the same semiconductor die as the driver 100.

In the example of FIG. 1, Q1 is an NPN BJT, but can a different type of transistor in other examples (e.g., a PNP BJT, a metal oxide semiconductor field effect transistor (MOSFET), etc.). The control circuit 110 generates another control signal, CTL2, to control the on/off state and the voltage transition of Q2. Q2 also couples to one terminal of capacitor C1, and the other terminal of capacitor C1 connects to another fixed supply voltage node 116 (e.g., ground). The current source device I1 is coupled in parallel with C1. At times, the designator "I1" is used herein to refer to the current source device, and at other times to the current through the current source device. Node 125 represents the node interconnecting the emitter of Q2, capacitor C1, and current source device I1. The current source device I1 may comprise one or more transistors, resistors, Zener diodes and/or other circuit components, and generally causes a predetermined amount of current to flow through the current source device in the direction of the arrow.

Control signals CTL1 and CTL2 generally comprise periodic signals (e.g., clock signals) and are complementary to each other in this example. That is, when CTL1 is a logic high, CTL2 is a logic low, and vice versa. Further, this means that when CTL1 is rising, CTL2 is falling, and vice versa (i.e., their transitions are complementary as well). The control circuit 110 receives CTL1 and generates CTL2 to be complementary to CTL1.

Figure 2:
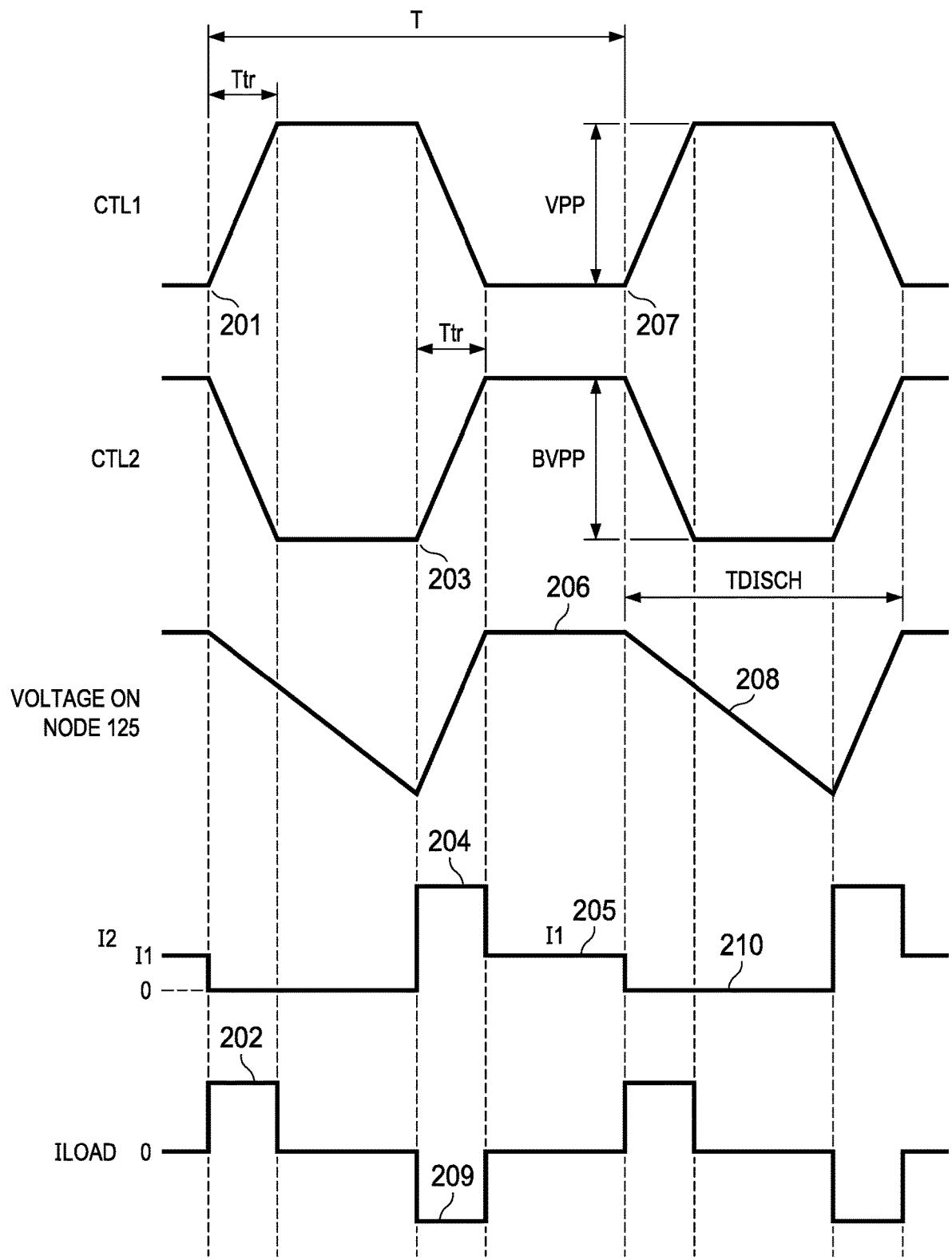
FIG. 2 provides a timing diagram illustrating the operation of the drivers described herein.

The operation of the driver of FIG. 1 will now be explained with regard to FIG. 1 and the corresponding timing diagram of FIG. 2. The driver 100 of FIG. 1 has two operational states that are controlled by CTL1 and CTL2. One operational state is the charge state and occurs when CTL1 is a logic high and CTL2 is a logic low. The other operational state is the discharge state and occurs when CTL1 is a logic low and CTL2 is a logic high. FIG. 2 shows sample waveforms for CTL1 and CTL2. The period of CTL1 is represented as T, and the rise time (and fall time) of CTL1 is represented as Ttr. The peak-to-peak voltage of CTL1 is shown as VPP. CTL2 is a similar waveform but its peak-to-peak voltage is proportional to VPP of CTL1. As shown, the peak-to-peak voltage of CTL2 is β*VPP, and thus β is the ratio of the peak-to-peak voltage of CTL2 to the peak-to-peak voltage of CTL1. The period and rise and fall times for CTL2 are the same as for CTL1.

In the charge state (initiated at 201), Q1 is turned on and Q2 is turned off. As Q1 is turned on the voltage on the output node 118, and thus the voltage across the capacitive load CL, increases sharply toward VDD. Because the voltage across the capacitive load CL changes sharply, a load current ILOAD flows into CL. The magnitude of ILOAD is given by equation (1) below:

$$ILOAD = \frac{CL * VPP}{Ttr} \quad (1)$$

The ILOAD waveform is shown in FIG. 2 and the magnitude of ILOAD during the Ttr time period is identified at 202. During the period of time that Q1 is on and the voltage on output node 118 is constant and not changing, ILOAD is zero and CL has been charged from the sudden ILOAD impulse current.

Reference numeral 203 identifies the beginning of the discharge state at which time Q2 is turned on and Q1 is turned off as shown. Q2 provides a current path for CL to discharge through the combination of C1 and I1. The discharge current from CL is shown as I2 in FIG. 1 and the I2 waveform is shown in FIG. 2. The magnitude of I2 at 204 during the rise time Ttr of CTL2 is generally of the same magnitude as the ILOAD at 202 during the charge state. The amount of charge that is delivered from CL during the rise time of CTL2 is generally equal to the amount of charge that CL received during the rise time of CTL1. The ILOAD current during the discharge state is indicated at 209 as a negative value indicating the direction of the ILOAD current is in the opposite direction from that shown in FIG. 1 by the arrow associated with ILOAD through CL.

I2 divides between C1 and I1. Thus, part of the charge from CL is used to charge C1, and the current through I1 represents the rest of the discharge current from CL. Once CL is discharged and the rise time Ttr of CTL2 has ended, the magnitude of I2 drops to the level of I1 as indicated at 205. The voltage on node 125 is shown in FIG. 2 at 206 and represents the voltage on C1 as C1 has been charged by CL.

During the next charge phase, which starts at 207, Q1 again turns on to charge CL and Q2 is turned off, as explained above. While CL is charging and with Q2 off, C1 discharges its charge (which was received by C1 from CL when Q2 was previously turned on) through the current source device I1 as indicated by current I3 in FIG. 1. The magnitude of I1 is configured such that C1 discharges slower than CL charges and discharges. The rate of discharge of C1 is indicated in FIG. 2 at 208 as the falling voltage of node 125. In general, C1 discharges over a period of time TDISCH that is approximately one-half of the period T of the control signals CTL1 and CTL2. Approximately means plus or minus 10%.

As can be seen in FIG. 2, during a portion of its period T, the I2 current through Q2 is zero, and I1 remains on continuously. However, the disclosed circuit consumes less power than in circuits such as a BJT emitter-follower in which a current source connected to the emitter is on continuously and at a higher level than I1. I1 is less than in prior BJT emitter-follower implementations because the disclosed circuit of FIG. 1 uses a significant portion of the period T to discharge C1 using I1.

The following discussion provides the mathematical relationship between several of the circuit parameters. Equation (1) above defines the current to CL during the charge and discharge states for CL. C1 has a capacitance that is not necessarily the same as the capacitance of CL. The ratio of C1 to CL is represented as a (i.e., C1=α*CL). The discharge current from CL during its discharge phase is the combined current of I1 and the current to C1, that is:

$$I2 \text{ (or } ILOAD) = I1 + \frac{\alpha CL * \beta * VPP}{Ttr} \quad (2)$$

As noted above, C1 is desired to subsequently discharge through current source device I1 in one-half of T and thus when C1 is discharging, I1 is:

$$I1 = \frac{\alpha CL * \beta * VPP}{0.5 * T} \quad (3)$$

Combining equations (1), (2), and (3) results in:

$$\frac{CL * VPP}{Ttr} = \frac{\alpha CL * \beta * VPP}{Ttr} + \frac{\alpha CL * \beta * VPP}{0.5 * T} \quad (4)$$

The product of $\alpha$ and $\beta$ is represented as:

$$\alpha\beta = \frac{1}{2\gamma + 1} \quad (5)$$

where $\gamma$ is the ratio of Ttr to T. It follows that I1 can be represented as:

$$I1 = \frac{2\gamma}{2\gamma + 1} * \frac{CL * VPP}{Ttr} \quad (6)$$

and, based on equation (1) thus, $$I1 = \frac{2\gamma}{2\gamma + 1} * ILOAD \quad (7)$$

Equation (5) relates $\alpha$ (ratio of C1 to CL), $\beta$ (ratio of the peak-to-peak voltage of CTL2 to the peak-to-peak voltage of CLT1), and $\gamma$ (ratio of Ttr to T). Thus, if any two of $\alpha$, $\beta$, and $\gamma$ are known, the third value can be calculated.

The aforementioned mathematical analysis and relationships are used in the following implementations. FIG. 1 illustrates C1 as being implemented on the same semiconductor die 102 as Q1, Q2, the current source device I1, and other components. In this example, C1 has a fixed capacitance value and is thus known to the user of the driver 100. The magnitude of I1 is trimmable under control by the control circuit 110. In one example, I1 is implemented as a bank of current sources controlled by switches which can be programmed to select one or more of the current sources. The switches can be programmed via the register set 120. The user has knowledge of the load 150 to be driven and thus knowledge of the value of the capacitance of CL. As such, the user can calculate $\alpha$ (ratio of C1 to CL). The user also has awareness of the timing of the control signal CTL1 to be used to provide the driver 100 and thus awareness of T and Ttr. The user can calculate $\gamma$ (ratio of Ttr to T). Knowing $\alpha$ and $\gamma$, permits the user to use equation (5) to calculate $\beta$, which dictates the peak-to-peak voltage of CTL2 to be generated by the control circuit 110 for driving Q2.

Figure 3:
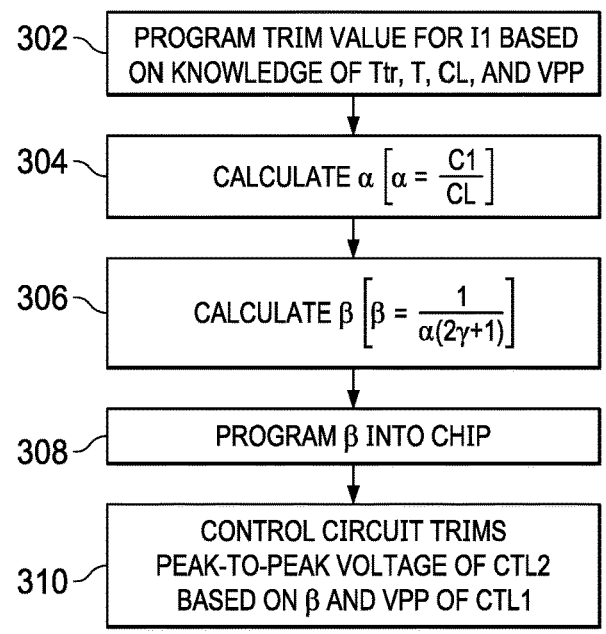
FIG. 3 includes a flow chart depicting a method associated with the driver of FIG. 1.

FIG. 3 shows an example of a method applicable to the driver 100 of FIG. 1. The operations in FIG. 3 can be performed in the order shown, or in a different order. Further, the operations can be performed sequentially, or two or more of the operations can be performed concurrently.

At 302, the method includes programming trim values into register set 120 by which the control circuit 110 trims I1. From equation (6), I1 is a function of $\gamma$, CL, Ttr, and VPP, and $\gamma$ is a function of Ttr and T. In operation 302, in one example the trim values include Ttr, T, CL, and VPP, or values indicative of Ttr, T, CL, and VPP. From some or all of those values, the control circuit 110 trims I1.

Programming values into the register set 120 in the example of FIG. 3 and the other examples described below includes, in some examples, transmitting values from a device external to the driver over a wired interface to the driver 100. The external device may be a device on the same circuit board as driver 100, or may be on a different circuit board.

At 304, the value of $\alpha$ is calculated as the ratio of C1 to CL. At 306, the value of $\beta$ based on $\alpha$ and $\gamma$ (Ttr/T) is calculated using equation (5). Then, at 308, the value of $\beta$ is programmed into the register set 120. Finally, at 310, the method includes the control circuit trimming the peak-to-peak voltage of CTL2 based on $\beta$ and the previously programmed trim value of the peak-to-peak voltage of CTL1. The control circuit may include or be coupled to a circuit that produces a voltage for driving the base of Q2. That circuit may be capable of producing a variable voltage that is configured by control circuit 110. The variable voltage can be generated using a voltage divider which can be implemented using switching resisters or switching capacitors.

Figure 4:
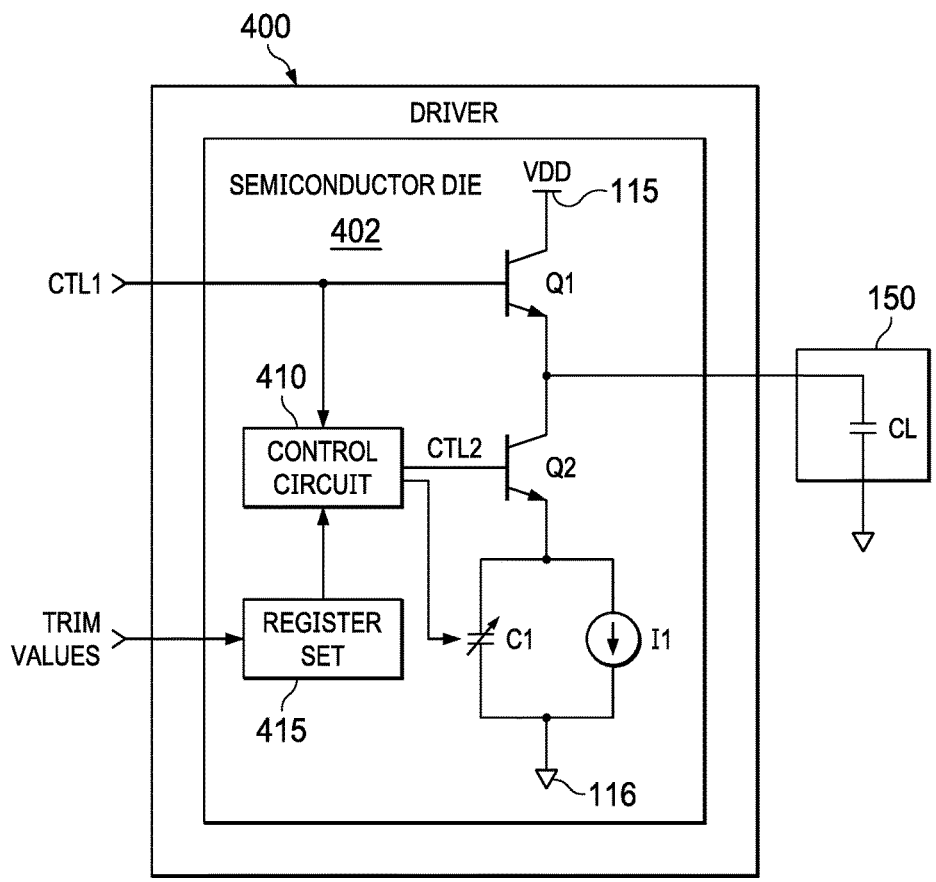
FIG. 4 illustrates another example of a driver for driving a capacitive load.

FIG. 4 shows another example of a driver 400 for driving capacitive load 150. The driver 400 includes transistors Q1 and Q2, capacitor C1, the current source device I1, a control circuit 410, and a register set 415. The collector of Q1 is connected to the fixed supply voltage node 115. The base of Q1 is coupled to receive input control signal CTL1 and CTL1 is also provided to the control circuit 410. The emitter of Q1 connects to the collector of Q2 at output node 118. The capacitive load CL is coupled to the driver 400 at output node 118.

The components of the driver 100 including Q1, Q2, C1, I1, the control circuit 410 and the register set 415 are formed on a common semiconductor die 402, that is, Q1, Q2, C1, I1, the control circuit 110 and the register set 415 are on the same chip. The capacitive load CL is not on the same semiconductor die 402 in this example, but in other examples, the capacitive load CL is on the same semiconductor die as the driver 400.

The control circuit 410 generates control signal, CTL2, to control the on/off state of Q2. Q2 also couples to one terminal of capacitor C1, and the other terminal of capacitor C1 connects to the other fixed supply voltage node 116. Current source device I1 is coupled in parallel with C1.

The example of FIG. 4 is similar to that of FIG. 1. A difference between the two examples is that in FIG. 1, C1 has a fixed capacitance, but in FIG. 4, C1 has a variable capacitance. In the example of FIG. 4, I1 has a trimmable current magnitude and C1 also is trimmable. In one example, C1 can be implemented as capacitors coupled in parallel and each such capacitor is selectable via a switch that is controlled by control circuit 410. Each capacitor may be of the same or different capacitor value as the other capacitors in the parallel group of capacitors. The operation of the driver 400 is largely as described above with regard to driver 100.

Figure 5:
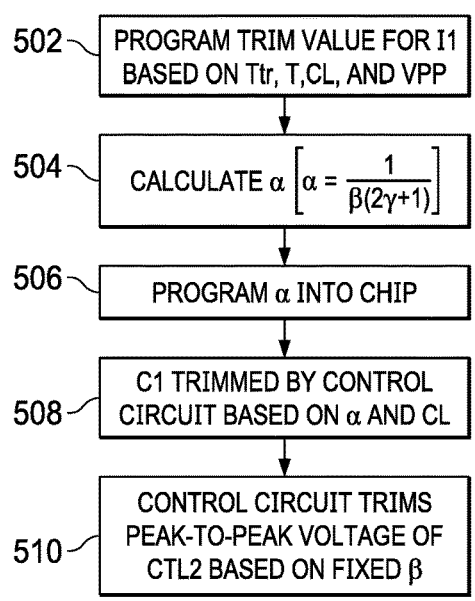
FIG. 5 includes a flow chart depicting a method associated with the driver of FIG. 4.

FIG. 5 shows an example of a method usable in conjunction with driver 400 of FIG. 4. The operations in FIG. 5 can be performed in the order shown, or in a different order. Further, the operations can be performed sequentially, or two or more of the operations can be performed concurrently.

At 502, the method includes programming trim values into register set 120 by which the control circuit 110 trims I1. Operation 502 is largely the same as operation 302 in FIG. 3. From equation (6), I1 is a function of γ, CL, Ttr, and VPP, and γ is a function of Ttr and T. In operation 502, in one example the trim values include Ttr, T, CL, and VPP. From some or all of those values, the control circuit 110 trims I1. At 504, the value of α is calculated as $1/(\beta(2\gamma+1))$ and, at 506, the value of α is programmed into the register set 415.

At 508, C1 is trimmed by the control circuit 410 based on the values of a and CL. C1 is a times CL, and thus is a scaled version of CL. In the example of FIG. 4, the value of β is fixed (e.g., stored in a non-modifiable part of the register set 415, set by logic gates within the control circuit 410, etc.), and thus is used at 510 by the control circuit 410 to trim the peak-to-peak voltage of CTL2 based on the value of VPP programmed into the register set 415 at 502.

Figure 6:
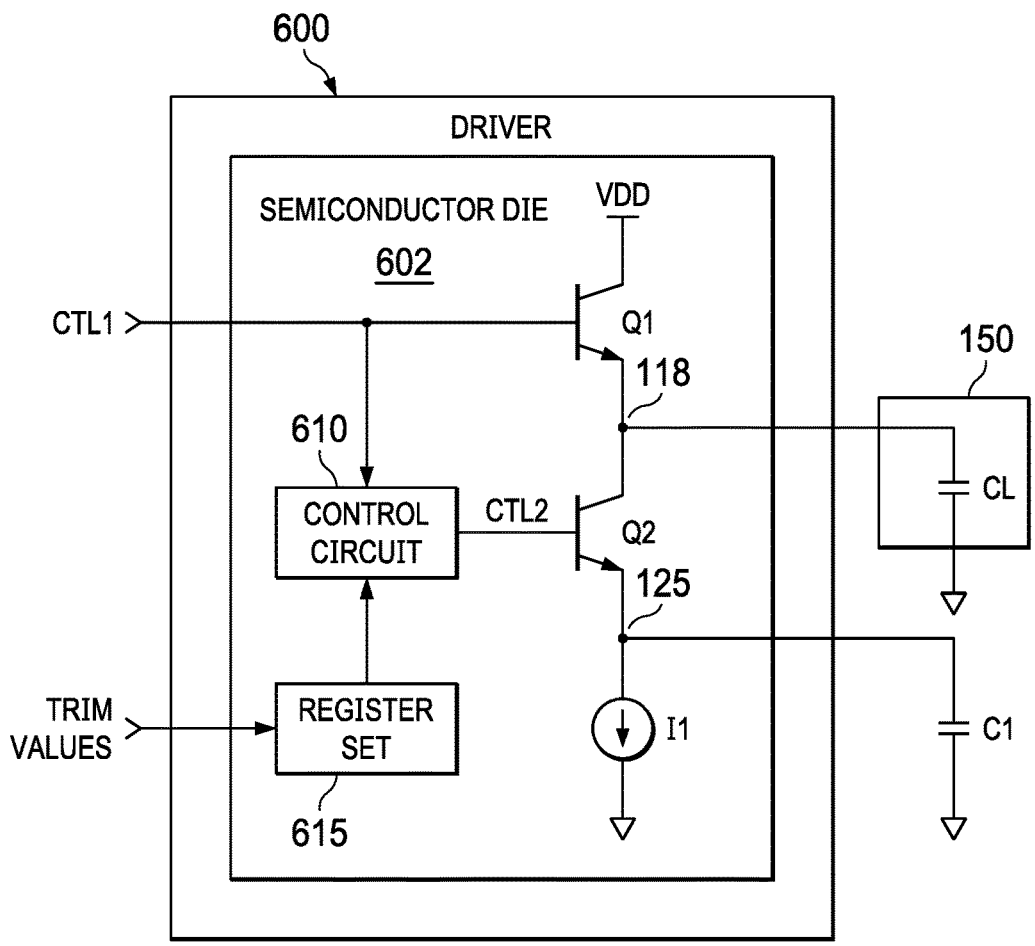
FIG. 6 illustrates yet another example of a driver for driving a capacitive load.

FIG. 6 shows another example of a driver 600 similar to the driver 100 of FIG. 1 or the driver 400 of FIGS. 1 and 4, respectively. The driver 600 of FIG. 6 includes a control circuit 600 to drive CTL2 to Q2 based on CTL1. The driver 600 includes a register set 615 as well that can be programmed with trim values by an external device as explained above.

A difference in driver 600 as compared to drivers 100 and 400 is that the capacitor C1 in FIG. 6 is external to the semiconductor die 602 which otherwise includes the control circuit 610, register set 615, Q1, Q2, and current source device I1. In this example, the user chooses C1 and places C1 on, for example, the same printed circuit board (PCB) as may contain driver 600.

Figure 7:
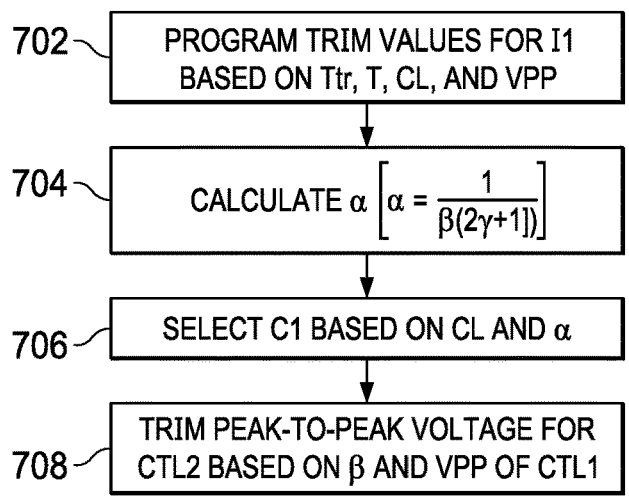
FIG. 7 includes a flow chart depicting a method associated with the driver of FIG. 6.

FIG. 7 shows an example of a method usable in conjunction with driver 600 of FIG. 6. The operations in FIG. 7 can be performed in the order shown, or in a different order. Further, the operations can be performed sequentially, or two or more of the operations can be performed concurrently. At 702, the method includes programming trim values into register set 615 by which the control circuit 610 trims I1. Operation 702 is largely the same as operation 302 in FIG. 3. From equation (6), I1 is a function of γ, CL, Ttr, and VPP, and γ is a function of Ttr and T. In operation 702, in one example the trim values include Ttr, T, CL, and VPP. From some or all of those values, the control circuit 410 trims I1. At 704, the value of a is calculated as $1/(\beta(2\gamma+1)$, with β being fixed.

At 706, the method comprises selecting a value for C1 based on the values of CL and α. In one example, C1 can be calculated as the product of a and CL (C1=α*CL). A capacitor with approximately the calculated capacitance is then mounted on the PCB along with driver 600 and connected to node 125 as shown in FIG. 6.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit, comprising:
a first bipolar junction transistor (BJT) including a first base, a first collector, and a first emitter, the first collector connected to a first supply voltage node;
a second BJT including a second base, a second collector, and a second emitter, the second collector connected to the first emitter at an output node;
a capacitor including a first capacitor terminal and a second capacitor terminal, the first capacitor terminal connected to the second emitter of the second BJT and the second capacitor terminal connected to a second supply voltage node;
a current source device connected in parallel with the capacitor in which the current source device is comprised of at least one of either a transistor or a Zener diode;
a control circuit coupled to receive a first control signal for the first base and, reciprocal to a logic state of the first control signal, to generate a second control signal for the second base; and
a programmable register set accessible to the control circuit, the programmable register set to be programmed with trim values, wherein the control circuit is to read the trim values from the register and trim a peak-to-peak voltage of the second control signal based on at least one of the trim values.

2. The circuit of claim 1, wherein the first BJT is an NPN BJT.

3. The circuit of claim 1, wherein the current source device is to produce a current that is of a magnitude which, when the second BJT is off, causes the capacitor to fully discharge over a period of time that is approximately one-half of a period of the first periodic control signal.

4. The circuit of claim 1, wherein:
during a rise time of a rising edge of the first periodic control signal, the first BJT is turned on to thereby cause a charge current to flow through the first BJT to the output node; and
while the second periodic control signal is low, the second BJT is turned off to thereby cause charge on the capacitor to be discharged through the current source device.

5. The circuit of claim 4, further comprising a capacitive load connected to the output node and the charge current through the first BJT flows to the capacitive load.

6. The circuit of claim 4, wherein during a rise time of a rising edge of the second periodic signal, the second BJT is turned on to thereby cause current to flow from the output node to both the capacitor and the current source device.

7. The circuit of claim 6, wherein the current source device is to source a current of a magnitude that is less than a magnitude of the charge current that flows through the first BJT to the output node.

8. The circuit of claim 1, further comprising a semiconductor die, wherein the capacitor and first and second BJTs are formed on the semiconductor die.

9. The circuit of claim 8, wherein:
the capacitor is trimmable;
a first value and a second value are storable in the register set; and
the control circuit reads the first and second values from the register set and uses the first and second values to trim the capacitor.

10. The circuit of claim 8, wherein:
the capacitor has a capacitance value that is fixed;
the circuit includes a register set in which a value is storable; and
the circuit includes a control circuit to read the value from the register set and to use the value to trim a magnitude of a voltage of a control signal to be provided to the second base.

11. A circuit, comprising:
a first bipolar junction transistor (BJT) including a first base, a first collector, and a first emitter, the first collector connected to a first supply voltage node, and the first base coupled to receive a first control signal;

a second BJT including a second base, a second collector, and a second emitter, the second collector connected to the first emitter at an output node;

a capacitor including a first capacitor terminal and a second capacitor terminal, the first capacitor terminal connected to the second emitter of the second BJT and the second capacitor terminal connected to a second supply voltage node;

a current source device connected in parallel with the capacitor in which the current source device is comprised of at least one of either a transistor or a Zener diode;

a control circuit coupled to receive the first control signal for the first base and, reciprocal to a logic state of the first control signal, to generate a second control signal for the second base; and a programmable register set accessible to the control circuit, the programmable register set to be programmed with trim values, wherein the control circuit is to read the trim values from the register and trim a peak-to-peak voltage of the second control signal based on at least one of the trim values and trim a capacitance value of the capacitor based on at least one other trim value.

12. The circuit of claim 11, wherein the trim values comprises at least one of:
a value indicative of a period of the first control signal;
a value indicative of a rise or fall time of the first control signal;
a value indicative of a capacitance of a capacitive load;
a value indicative of a current through the first BJT when charging the capacitive load; and
a value indicative of a peak-to-peak voltage of the first control signal.

13. The circuit of claim 11, wherein the control circuit is to trim, based on at least one of the trim values read from the register set,
a magnitude of current through the current source device.

14. The circuit of claim 11, wherein:
when the first control signal is asserted to a first logic state and the second control is asserted to a second logic state, the first BJT is turned on to conduct current from the first power supply node to the output node, and the second BJT is turned off and the capacitor discharges through the current source device; and during at least a portion of time during which the first control signal is asserted to the second logic state and the second control is asserted to the first logic state, the first BJT is turned off, the second BJT is turned on, discharge current flows into the output node and through the second BJT and divides between the current source device and the capacitor.

15. A circuit, comprising:
a first bipolar junction transistor (BJT) including a first base, a first collector, and a first emitter, the first collector connected to a first supply voltage node;
a second BJT including a second base, a second collector, and a second emitter, the second collector connected to the first emitter at an output node;
a current source device comprised of at least one of either a transistor or a Zener diode in which the current source device is connected to the second emitter at a second node and configured to be coupled to a capacitor at the second node in parallel with the current source device;
a control circuit coupled to receive a first control signal for the first base and, reciprocal to a logic state of the first control signal, to generate a second control signal for the second base; and
a programmable register set accessible to the control circuit, the programmable register set to be programmed with trim values, wherein the control circuit is to read the trim values from the register and trim a peak-to-peak voltage of the second control signal based on at least one of the trim values.

16. The circuit of claim 15, wherein:
when the first control signal is asserted to a first logic state and the second control signal is asserted to a second logic state, the first BJT is turned on to conduct current from the first power supply node to the output node, and the second BJT is turned off and the capacitor discharges through the current source device; and
when the first control signal is asserted to the second logic state and the second control signal is asserted to the first logic state, the first BJT is turned off, the second BJT is turned on, discharge current flows into the output node and through the second BJT and the current source device.

* * * * *